United States Patent [19]

Sullivan

[11] 4,260,675
[45] Apr. 7, 1981

[54] PHOTOPRINTING PLATE AND METHOD OF PREPARING PRINTED CIRCUIT BOARD SOLDER MASKS THEREWITH

[76] Inventor: Donald F. Sullivan, 115 Cambridge Rd., King of Prussia, Pa. 19406

[21] Appl. No.: 37,949

[22] Filed: May 10, 1979

[51] Int. Cl.³ .......................... G03C 5/00; G03C 5/06; G03C 5/04
[52] U.S. Cl. .................................. 430/315; 355/78; 355/132; 430/5; 430/325; 430/327; 430/396; 430/494
[58] Field of Search ................ 96/36, 36.2, 35.1, 38.3, 96/44; 427/164, 165; 355/78, 132; 430/4, 5, 396, 951, 315, 325, 327, 494

[56] References Cited

U.S. PATENT DOCUMENTS

| | | | |
|---|---|---|---|
| 3,615,468 | 10/1971 | Tiala | 96/44 X |
| 3,622,319 | 11/1971 | Sharp | 430/396 |
| 3,669,770 | 6/1972 | Feldstein | 430/5 X |
| 3,712,816 | 1/1973 | Blome et al. | 430/5 |
| 3,720,143 | 3/1973 | Hashimoto et al. | 430/5 |
| 3,824,104 | 7/1974 | Kloczewski et al. | 96/35.1 X |
| 3,897,251 | 9/1975 | Detrick et al. | 96/38.3 |
| 3,936,301 | 2/1976 | Schneider | 96/44 X |
| 3,942,981 | 3/1976 | Sato | 96/36 |
| 3,965,277 | 6/1976 | Guditz et al. | 96/36.2 X |
| 3,986,876 | 10/1976 | Abita | 96/38.3 |
| 4,102,683 | 7/1978 | Di Piazza | 430/396 X |
| 4,113,486 | 9/1978 | Sato | 96/36 |
| 4,166,148 | 8/1979 | Sakurai | 430/5 |

OTHER PUBLICATIONS

Rothman et al., IBM Tech. Disclosure Bulletin, vol. 14, No. 3, 1971.

*Primary Examiner*—Edward C. Kimlin
*Attorney, Agent, or Firm*—Laurence R. Brown

[57] ABSTRACT

Paste-consistency photopolymer is imaged onto printed wiring boards by use of glass exposure plate having opaque image areas which contact portions of the board on which photopolymer is not to be exposed, and having clear areas elevated above the photopolymer surface. A printed wiring board is coated with UV-curable solder mask photopolymer and exposed to a strong UV lamp through the glass plate pressed against the printed wiring board by atmospheric pressure. As the glass plate does not contact the photopolymer, trapped air can escape and the gloss surface of the photopolymer is preserved. A non-collimated light source is used to produce high resolution photopolymer coatings at line speeds of 12 feet per minute. Where opaque and raised images contact printed wiring board, photopolymer there between is extruded sideward to form beneficial areas of increased photopolymer thickness. In addition to solder mask imaging, graphics of several colors can be produced.

7 Claims, 8 Drawing Figures

PHOTOPRINTING PLATE AND METHOD OF PREPARING PRINTED CIRCUIT BOARD SOLDER MASKS THEREWITH

TECHNICAL FIELD

This invention relates to printing plates for development of images by photographic exposure and more particularly it relates to the processing of printed circuit assemblies by photographic methods.

BACKGROUND ART

This disclosure relates to equipment and procedures for achieving an improved solder mask coating on printed wiring boards (PWB). More specifically, this disclosure teaches how paste-consistency photopolymer coatings are applied over the entire board surface; how the photopolymer coating is selectively exposed to UV light to harden wanted photopolymer, and how unhardened photopolymer is removed.

In order to place this disclosure in proper perspective, a brief description of the current art of solder mask application and needed improvements will be presented.

In the manufacture of printed wiring boards, it is becoming increasingly commonplace to solder mask the finished boards exterior surfaces. Typically, the solder mask covers the base laminate and conductor traces, leaving the circuit pads free. After electrical components are added to the PWB, the assembly is conveyed over a wave of molten solder which solders all components in seconds. The solder mask sheds the molten solder, so that only circuit pads receive solder. The solder mask thus prevents solder bridges between adjacent conductors and reduces the amount of rework and post-soldering inspection required.

The solder mask remains in place after soldering and serves as a life long insulator and environmental barrier.

Traditionally, solder masks have consisted of epoxy thermosets applied to the PWB by screen printing and cured by oven baking. More recently, UV-curable photopolymers have been introduced as a way to overcome the lengthy bake cycle required by the epoxies. These photopolymers are generally screen printed and cured in 10 seconds when exposed to a 200 watt per inch UV lamp source.

The full potential of the UV-curable photopolymers cannot be achieved by screen printing because of requirements imposed by PWB users. First, it is generally necessary to apply a solder mask coating of approximately 0.002 inches thick to achieve a continuous coating free of "Skips", which are areas where the mask fails to fill the spaces between conductors down to the base laminate.

The surface of a typical PWB is highly irregular, having conductor heights of 0.003 to 0.005 inches above the base laminate. This surface irregularity decreases printing resolution and causes "smearing" of the epoxy and photopolymer onto circuit pads thereby preventing good soldering and partially defeating the purpose of solder masking. Thus, if skip-free printing is achieved, then smearing is frequently experienced.

Photoimaging of the photopolymer is the best way to achieve impressions free of skips and smears, while maintaining high accuracy. Three techniques currently being used will be described.

In the present art UV-curable photopolymers are being photoimaged to provide printed wiring board cover coats and solder masks, avoiding both skips and smears. Known techniques include covering the PWB with photopolymer via roller coating, then laminating a thin plastic sheet over the coated board, exposing thru a photographic film in contact with this thin plastic sheet.

Several disadvantages result from this technique:

1. The thin plastic sheet causes a loss of resolution, since the photographic film emulsion is separated from the photopolymer by the film thickness, and light inadvertently hardens a portion of unwanted photopolymer.

2. The thin film is scrapped, wasting one square foot of film for each square foot of board surface coated.

3. Entrapped air results unless the protective film is vacuum laminated.

4. During the exposure cycle, the pressure of the photographic film against the photopolymer forces the photopolymer into the PWB holes, wasting photopolymer and increasing the washout time required. The photopolymer is also thinned out over top of the conductors by this extrusion process.

Another method is used for photoimaging UV-curable photopolymers, in which a collimated light source is used to expose the photopolymer through a photographic film positioned above the printed wiring board; a process known as off-contact exposure. There are two primary disadvantages to this approach:

1. The collimated light source is expensive, and generally priced beyond the reach of smaller PWB manufacturers.

2. A loss of resolution is experienced because of the off-contact separation and photographic film and photopolymer, even with a collimated light source.

In the present art there is one other alternative to screen printing solder mask which solves both the problems of smearing and skipping; "dry film soldermask" as manufactured by the DuPont Company. Dry film soldermask consists of a tacky photopolymer film sandwiched between two carrier films, and supplied in roll form. The dry film is laminated onto the board via a vacuum laminator; selectively exposed to UV light and developed for 2.5 minutes in a solvent spray bath. Smears are largely eliminated, as are skips, and the resolution is far better than screen printing.

However, there are several serious problems with this dry film:

1. The dry film costs approximately 10 times that of epoxy and 5 times that of UV-curable photopolymer.

2. Labor required to laminate, expose and develop the dry film is excessive.

3. The processing equipment is excessively expensive.

4. For every square foot of photopolymer used, there are two square feet of accompanying plastic film which are wasted.

5. For every square foot of board surface covered approximately 1.25 square feet of dry film is required. Losses are attributed to the vacuum laminator and the need for the roll width to exceed the board width.

6. When simultaneously exposing the dry film on two sides of the board ultraviolet light travels through the base laminate and partially exposes the dry film on the opposite side unless an opaque laminate is used. This thru-laminate exposure causes partial polymerization and results in smears and loss of resolution.

In the present art, glass photographic plates are used to expose photopolymers, in both the contact and off-contact modes. The current art glass photographic plate has the opaque emulsion affixed to the glass, essentially Coplaner with the lower glass surface, since the emulsion is of the order of several microns thick. The use of a conventional glass photographic plate has several disadvantages:

1. If used in off-contact mode, a collimated light source is required for good resolution.
2. If used on contact:
   2A. The glass must be lowered to contact the photopolymer surface in a vacuum chamber or air will be trapped, and the gloss surface marred.
   2B. Excessive solder mask photopolymer is required, since the glass lower surface must "float" on photopolymer without touching the underlying conductors. If conductor traces are 0.004 inches high, then the photopolymer thickness must be 0.005 inches to ensure that conductors receive at least 0.001 inches of photopolymer.
   2C. The photopolymer is forced into circuit holes, making removal more difficult.

Accordingly, one objective of this invention is to provide an exposure plate which can be used to produce a photopolymer coating which is free of skips, smears, pinholes and entrapped air, while retaining a glossy surface which is esthetically pleasing.

Another objective is to provide an increased photopolymer thickness due to extrusion of photopolymer from the opaqued areas by action of the exposure plate image. This increased thickness enhances the solder mask by providing a thicker mask between circuit pads and adjacent conductors.

Another objective is to produce a photopolymer coating having high resolution with a non-collimated light source, using both conveyorized and drawer-type lamps.

Another objective is to obtain a high production rate with unskilled labor.

Another objective is to be able to expose the photopolymer with a conveyorized UV curing lamp system so that the exposure cycle is reduced to the order of 10 seconds, using conveyorized UV curing lamps currently in use in PWB manufacturing.

A corollary objective is to provide an exposure plate and exposure assembly capable of withstanding the high temperatures encountered in repeatedly conveying the exposure assembly under high intensity lamps.

Another objective is to minimize waste of photopolymer and to eliminate the wasteful practice of consuming plastic film.

Another objective is to provide equipment which will work well with many photopolymers available commerically, as well as new UV curing materials which may become available in the future.

A further objective is to provide a photopolymer coating which is cured in two stages. The first stage is cured to the extent that unexposed photopolymer can be washed out without affecting the exposed photopolymer. After washout and inspection, the final cure is accomplished.

A further objective is to provide a photographic step tablet which produces an indication that each PWB is properly exposed.

Another objective is to provide improved methods for photoimaging UV-curable plating resists and etch resists used in the manufacture of printed wiring boards.

Those patents representative of the prior art photoprinting techniques in the printed circuit board art are:

U.S. Pat. No. 3,965,277—Guditz et al., June 22, 1976 which processes printed circuits by UV photo resist exposure; and U.S. Pat. No. 3,936,301—Schneider, Feb. 3, 1976 which employs contact type photolithographic masking processes to develop mask patterns.

BRIEF DESCRIPTION OF THE INVENTION

UV (ultraviolet) curable photopolymers can be exposed and imaged with high accuracy and resolution using a non-collimated light source, using the equipment and procedures disclosed and described herein.

When used to expose a printed wiring board coated with UV-curable solder mask photopolymer, an exposure plate of glass is prepared which has clear areas elevated above the photopolymer surface, while opaque areas are in contact with or submerged into the photopolymer. When registered over the coated PWB and evacuated, the opaque areas are in firm contact with selected printed wiring board conductors, so that when subjected to a high-intensity non-collimated light source, light is prevented from reaching that photopolymer beneath the opaque areas, while photopolymer not covered by opaque material is hardened. Elevated portions of the exposure plate provides for escapement of trapped air and also maintains a glossy photopolymer surface.

The pressure of the opaque image areas against the printed wiring circuit pads extrudes a portion of that photopolymer from under the opaque areas and into the clear areas, prior to exposure.

This extruded photopolymer is polymerized to form an annular ring of increased thickness around printed wiring circuit pads, providing a thicker solder mask coating, and added protection for adjacent conductors.

The equipment and procedures described provides solder mask free of pinholes, voids and photopolymer smears, with labor and material savings of 80 percent that of known photoimaged dry film solder mask, using exposure lamps currently in use at production facilities.

In addition to conventional UV-curable solder mask imaging, the raised image exposure plate is used to compensate for positional inaccuracies, such as base laminate shrinkage of flexible circuits. The raised opaque areas for this special application are balls or spheres secured to the glass with a pliable mastic, which permits the balls to seat themselves symmetrically within the circuit holes and shadow the circuit pads from the UV lamp source.

The disclosed equipment and procedures are also used to produce graphic images of one to four colors with extreme precision and resolution on substrates too large or otherwise unsuitable for conventional offset printing presses.

BRIEF DESCRIPTION OF THE DRAWINGS

Further background, objects, advantages and features of the invention will be set forth throughout the following specification, with reference to the accompanying drawings, wherein.

DETAILED DESCRIPTION OF A PREFERRED EMBODIMENT

Figure 1:
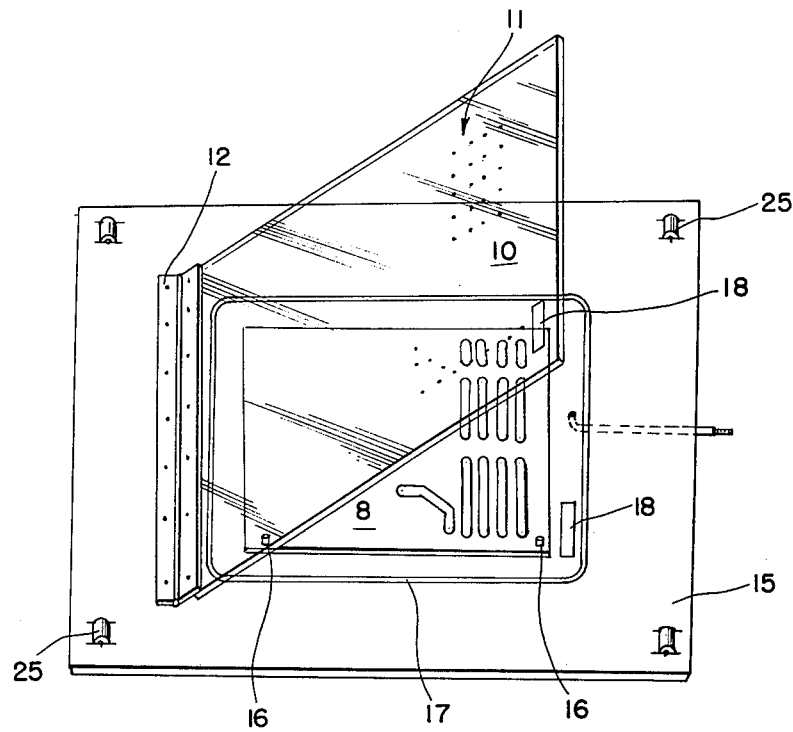
FIG. 1 is a perspective sketch of an assembly holding printed circuit boards for the photoprinting techniques of this invention.

FIG. 1 shows the PWB (printed wiring board) 8 exposure assembly. The exposure assembly mounts the coated PWB between two transparent exposure plates, the upper one 10 only shown for clarity. Each plate 10 contains the image 11 of the solder mask pattern for the corresponding side of the PWB. The plates 10 are registered and restrained by a hinge 12.

The assembly is connected to a vacuum source via flexible pipe 14 so that both sides of the PWB is evacuated when the two plates 10 are closed in registration. When closed and evacuated, atmospheric pressure holds the plates and PWB together while the assembly is conveyed under the UV lamp source of FIG. 2 for example. In one mode the topside of the PWB is exposed and the photopolymer selectively hardened. Then the assembly is turned over and again conveyed under the lamp, partially hardening the photopolymer on the other side of the PWB. The vacuum is then removed; the PWB is removed and another inserted and the cycle repeated.

Unhardened photopolymer is removed by immersion in a compatible solvent. After inspection, the PWB is again exposed to the UV lamp for final cure and complete polymerization of the solder mask. Prior to final cure the partially-cured polymer can be removed from the PWB using a strong solvent such as methylene chloride. After final cure the photopolymer becomes a permanent part of the board.

Referring again in FIG. 1, exposure plate 10 is rigid and preferably of glass, to maintain dimensional stability when subjected to the high temperatures of the UV curing lamps. Image 11 on plate 10 is formed with clear areas transparent to UV light, and opaque areas which are substantially offset from the plane of the lower glass surface by approximately 0.010 inches. FIG. 4B shows the relationship between glass plate 10 lower surface and PWB 8 conductor top surfaces.

Plate 15 is also a rigid transparent plate preferably acrylic plastic when used in a simultaneous development mode for both sides of the PWB 8 at one time, thereby serving to expose the bottomside of PWB 8 and having a raised image corresponding to the solder mask pattern of PWB bottomside. Pins 16 secure PWB 8 in register. Hinge 12 secures the two plates together in register and provides access. Vacuum port 4 provides for the evacuation of air, while seal 17 maintains the vacuum.

Step tablet 18 is a photographic film having varying shades of gray, ranging from clear to opaque, to provide an indication of the degree of exposure of each side of each PWB. When the image generated by the step tablet is developed along with the PWB, the operator can tell whether the exposure time should be increased, decreased or left unchanged.

Figure 2:
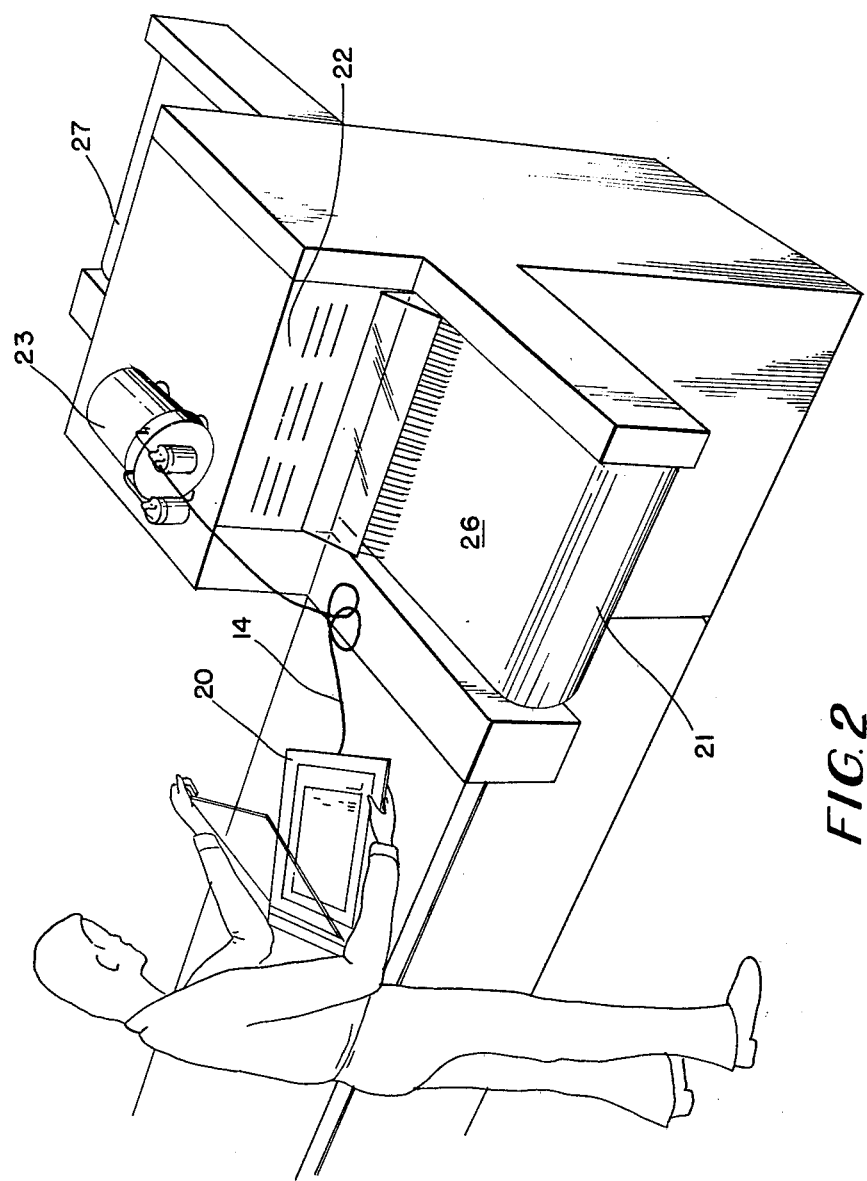
FIG. 2 is a perspective sketch of a conveyor system for exposing and curing printed circuit assemblies in accordance with this invention.

FIG. 2 shows the exposure assembly of FIG. 1, identified as 20, being used in conjunction with a conveyor 21 leading to a UV lamp source under cabinet 22. Also flexible cable hose 14 is connected to a vacuum pump 23.

Referring again to FIG. 1, the exposure assembly contains rollers 25 to facilitate pulling the assembly under the UV lamps in the direction counter to conveyor belt direction, so it is entered at belt position 26 and when passing through to position 27 it can be retrieved by pulling on cable hose 14.

Figure 4A:
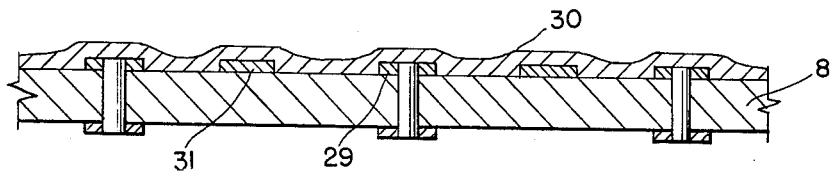
FIGS. 4A, 4B and 4C are respective comparison fragments, partly in cross section, respectively of a printed circuit board with a photo sensitive masking layer, development of that board with a photographic exposure printing plate in mated registration therewith, and a processed board with developed mask in place.
Figure 4B:
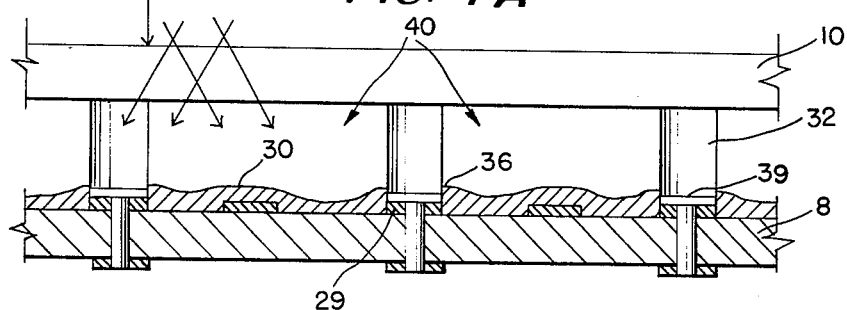
Figure 4C:
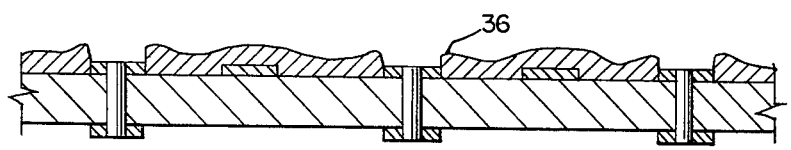

FIGS. 4A, 4B and 4C show three sections of the PWB; the PWB coated with photopolymer, the PWB contacted by the image on the exposure plate; and the cured photopolymer resulting from UV exposure. In FIG. 4A photopolymer 30 is seen to conform to the topology of the conductors, with the photopolymer thickness uniform over base laminate, circuit pads 29, and conductor traces 31. Uniform coatings are achieved by screen printing the entire board surface using a resilient fabric such as polyester. This permits a fine mesh fabric to be used, and skips avoided, while still applying a coating thickness of 0.002 inches or less. The photopolymer is applied with a paste-like consistency.

FIG. 4B shows exposure plate 10 and spacer 32 with opaque areas 39 correctly registered with PWB 8 circuit pads 29. Opaque spaces 32 are in intimate contact with circuit pads 29, preventing any direct or indirect uncollimated light rays 35 incident through glass plate 10 from reaching the thin layer of photopolymer 30 sandwiched between spacers 32 and circuit pads 29.

When exposure plate 10 is brought into contact with PWB 8 by vacuum action, photopolymer 30 which covers the pads 29 in FIG. 4A is forced or extruded sidewards, thereby forming annular rings 36 in FIG. 4B around the circular circuit pads 29.

Figure 3A:
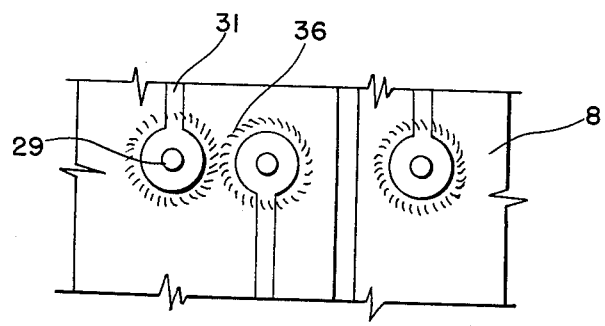
FIGS. 3A and 3B are respectively plan and section views of a broken away section of printed circuit board processed in accordance with the teachings of this invention.
Figure 3B:
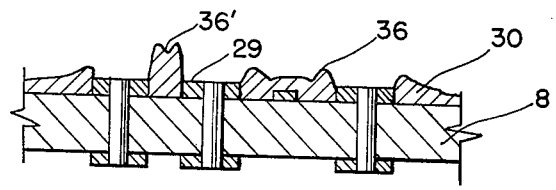

These annular rings 36 enhance the ability of the solder mask to prevent solder bridges during wave soldering, for the added photopolymer thickness of the annular rings withstands molten solder better than a thinner coating. FIG. 3 shows an expanded plan view and cross section of adjacent pads and conductors and the annular rings.

Circuit pads 29 are surrounded by annular rings 36. While the annular rings around isolated pads may be only slightly thicker photopolymer than that over the base laminate, where two pads are closely spaced as at 36', the annular rings can combine to yield even greater thickness and protection. The thickness of the annular rings is affected by the quantity of extruded photopolymer and its viscosity.

Referring again to FIG. 4B, it is illustrated how clear areas of plate 10 are elevated above photopolymer 30. Open spaces 40 permit trapped air to boil out of the photopolymer and to be conducted out of the exposure assembly via the vacuum port.

FIG. 4B also illustrates how the surface gloss of applied photopolymer is maintained, since the PWB is contacted only at locations where the photopolymer is to be removed.

This disclosed technique also offers a method for error correction not available with other solder masking techniques. In the manufacture of flexible printed wiring circuits, the base laminates do not have the dimensional stability of the rigid laminates, so that after etching, the base laminate can change dimensions unpredictably and to a degree than an exposure plate with fixed opaque areas will not be suitable for all circuits.

Figure 5:
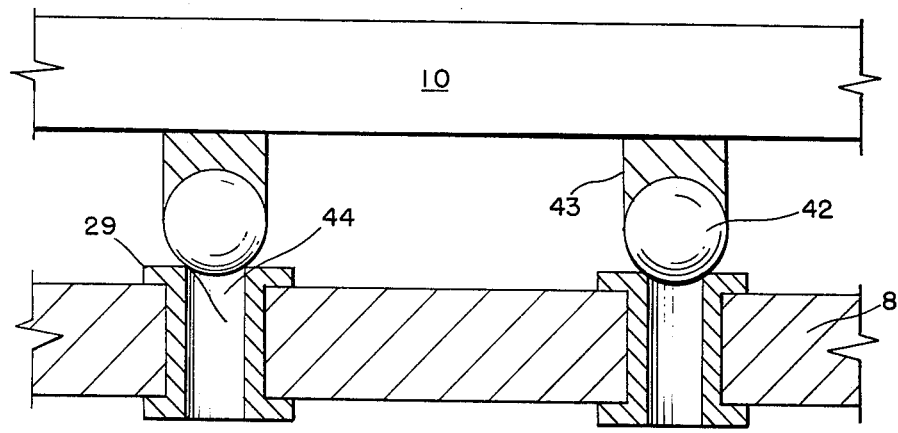
FIG. 5 is a fragmentary portion of an alternative photographic exposure printing plate embodiment of the invention in registration with a printed circuit board wiring pattern.

FIG. 5 shows a section of an exposure plate in which the raised images are balls 42 or spheres secured to the exposure plate 10 by means of a pliable mastic 43. When the ball is forced downward onto PWB 8 it should seat symmetrically over circuit hole 44 to produce shadowing of the circuit pad. If, because of dimensional changes in the base laminate, the ball is not positioned symmetrically over circuit hole 44, then the downward pressure of the exposure plate 10 and the edge 45 of circuit pad 29 will force the ball sideward to seat properly and thus compensate for the positional errors.

The disclosed equipment and procedures are applicable to a large number of existing photopolymers using available curing equipment and can be adapted to image photopolymer on a wide spectrum of substrates. This section will describe one application, that of solder mask imaging on a printed wiring board having conductor heights above the laminate of approximately 0.003 inches. Each step will be described in detail.

The steps are:
1. Prepare PWB exposure plate and exposure assembly.
2. Apply UV curable soldermask onto solder side of PWB.
3. Place coated board onto PWB mounting and exposing assembly.
4. Apply UV curable soldermask onto component side of PWB.
5. Apply vacuum to assembly.
6. Convey assembly under UV lamp source, exposing and hardening solder side soldermask.
7. Turn assembly over, convey under UV lamp source exposing and hardening component side soldermask.
8. Remove PWB from assembly and washout unhardened soldermask.
9. Final UV cure.

A glass plate having a photosensitized coating is manufactured by Eastman Kodak Company, which is 0.200 inches thick. This sensitized emulsion is exposed with the soldermask artwork positives, producing an opaque field on the glass, with clear areas corresponding to PWB circuit pad locations. Onto the emulsion side of the glass a coating of photopolymer is applied to a thickness of 0.010 inches; the preferred photopolymer being sold by Advance Processing and Supply Company of Chicago, Ill., product designation UVEX HUG 465. This paste photopolymer is uniformly coated by placing 0.010 inch spacers along the edges of the glass, on which a doctor blade rides to remove any excess photopolymer. This photopolymer is hardened by conveying the glass plate under a 200-watt per inch UV lamp at a rate of 10 feet per minute. The glass plate is subjected to a trichloroethane solvent spray bath for 2.5 minutes, removing all unhardened photopolymer, and leaving raised areas corresponding to PWB locations to be free of soldermask. The glass plate still has a coating of opaque emulsion which must be removed. This is accomplished by immersion in a household bleach solution of 5% sodium hypochlorite which removes the emulsion without affecting the raised photopolymer images.

The raised images are made opaque on the bottom as indicated at 39 in FIG. 4 for example by roller coating with a thin layer of black silicone rubber compound as sold by the General Electric Company. This coating provides opacity and a non-sticking surface to prevent the solder-mask for adhering in later use.

The application of UV curable soldermask to the PWB is accomplished by screen printing a 0.002 inch coating using a 200×200 mesh fabric and photopolymer having a viscosity of 400 cps at 25° C. For higher viscosities, an electrically heated screen can be used to lower the viscosity suitably. The screen does not require a stencil, unless large ground plane areas are to be left free of mask. With regard to the UV-curable soldermask, there are many types currently available which can be applied as described and exposed and washed out with the same equipment. The following lists three of these:

| Maufacturer/Location | Product Designation |
| --- | --- |
| W. R. Grace Company, Columbia, Md. | SPR-159 |
| Colonial Printing Ink Co., E. Rutherford, N.J. | UV 50-40 |
| Dynachem, Vienna, Va. | Soldermask 17 |

After coating both sides of PWB, the exposure assembly is evacuated to 22 to 28 inches of mercury and conveyed under a two UV lamp assembly each having intensities of 200 watts per inch, at a speed of 10 feet per minute. The preferred UV curing equipment is the Model 110 as manufactured by the Argus Company of Hopewell, N.J. This first trip under the lamps polymerizes the soldermask to the degree that the exposed photopolymer will withstand the washout cycle but can still be removed with methylene chloride. While still evacuated, the assembly is again conveyed under the lamps to polymerize the second side of PWB soldermask.

Unhardened photopolymer is removed from PWB by subjecting the board to a solvent spray, preferably trichloroethane, manufactured by Dow Chemical and marketed as CHLOROTHENE NU. Using a DuPont A-24 DEVELOPER spray unit, the washout cycle will be from 30 seconds to 2½ minutes, as required to obtain a step 7 on the image produced by the step tablet.

The step tablet is a strip of readily available photographic film used for determining the degree of exposure and development of photographic emulsions. The STOUFFER GRAPHIC ARTS 21 STEP film is used in the exposure assembly. The film strip is placed on a clear spacer strip approximately 0.010 inches thick, so as to bring the plane of the emulsion of the film strip to the same level as the solder mask opaque image. A release agent is applied to the film.

After washout and inspection, the solder mask photopolymer is given a final cure to complete the polymerization process. The PWB is again conveyed under the UV lamp assembly, once for each side and again at a speed of 10 feet per minute. Since there is no exposure plate interposed, the photopolymer receives more UV energy than before and a full cure is effected.

In addition to soldermask photoimaging the same techniques and equipment are applicable to other photoimaged tasks. Within the printed circuit industry, UV-curable plating and etch resists can be photoimaged with a significant saving of photopolymer. In this application, where there is typically 50% hardened resist, with the remainder washed out, the screen printing step coats the wanted areas plus a small fringe which is contacted by the raised image of the exposure plate and partially extruded back into the wanted area. Savings in photopolymer and washout solvent thus result. Suitable plating and etch resists are made by W. R. Grace, product designation SPR-7263LR and SPR 7263M respectively.

Dry film photo resists used for plating, etching and for soldermasks can be exposed by the disclosed raised plate to good advantage. First, with the dry film being heated slightly by the exposure lamps, the pressure of the vacuum will force a slight extrusion of photopolymer caused by the raised images. This extruded photopolymer will be hardened by the light and will make a slightly raised impression, similar to that shown in FIG. 2. This raised portion of plating resist provides added immunity to plating resist entrapment, should the plating thickness exceed the nominal value. Examples of dry photoresists which can be exposed are the following DuPont products:

Riston 730S; SM-1, 730FR, Dry Film Soldermask Riston Photopolymer Film Resist, Types 6; 110S; 1010; X113S; 1020; and 310.

In addition to etch resist, plating resist and soldermask imaging, PWB marking can be accomplished using UV curable marking inks readily available. Board marking is alternately referred to as applying legend, nomenclaturing or "silk screening", and means designating the location and value of electrical components. One suitable UV curable marking ink is made by W. R. Grace, product SPR 1103DW.

The disclosed exposure plates and exposure assembly can be used to produce graphic arts images, using UV-curable inks which are readily available. Both line and continuous tone images can be produced from the described exposure plates.

Very large four color half-tone transparencies can be made using two exposure assemblies, each imaging two colors on a transparent substrate, providing an improved method for making transparencies too large for available offset presses and too detailed for screen printing.

Having therefore set out the construction and operation of a preferred embodiment of the invention and advanced the state of the art, those features of novelty believed descriptive of the spirit and nature of the invention are set forth with particularity in the appended claims.

Industrial Application

There is provided an improved method of making photo images particularly useful in the production of printed circuits where a solder mask is to be put on a printed wiring board to limit solder flow to only desired contact areas with the printed circuit wiring pattern.

Thus, a raised pattern on a transparent photomask having an opaque contact surface penetrates a photo sensitive layer of paste-like consistency to expose those areas not penetrated at desirable solder locations so that photo developing techniques can harden and remove the layer. The layer serves as a permanent protective mask over the circuit pattern after use as a solder mask.

I claim:

1. The method of photoprinting a pattern upon the surface of an object having thereon a paste-like layer of photo sensitive material, comprising the steps of:
   providing a photo pattern constituting a transparent body generally mating with said surface and disposing the pattern thereon in the form of opaque members extending from the transparent body in relief pattern far enough to contact the photo sensitive material on the surface of the object while leaving a gap between the surface and the transparent body elsewhere,
   contacting the photo sensitive layer with only the opaque members and extruding therewith at least a part of the paste-like layer therefromunder to form ridges of increased layer thickness of the said paste-like layer adjacent to the said opaque members,
   and passing non-collimated photo energy through said transparent body and said gap to expose said photo sensitive material and change its characteristics only where not contacted by said opaque members of said pattern.

2. The method defined in claim 1 wherein said object is printed circuit board with a wiring pattern requiring soldered joints at selected locations and with said layer covering the wiring pattern, including the steps of:
   establishing said opaque members in positions to mate with said selected locations,
   registering said members with said locations,
   contacting the layer at said locations with said members to thereby produce ridges of increased layer thickness surrounding said locations before passing said photo energy,
   removing the unexposed layer where contacted by the opaque members and preparing the wiring pattern to receive solder at the contact positions,
   and passing solder over said layer to thereby adhere only on the wiring at said contact locations whereby the layer with changed characteristics serves as a solder mask to prevent any solder from adhering to other portions of the wiring pattern.

3. The method defined in claim 2 wherein the relief pattern is extended completely through the layer to reach the surface of the object.

4. The method defined in claim 1 including the step of disposing said opaque members to penetrate said photo sensitive material to extrude sideways onto areas to be hardened.

5. The method defined in claim 1 providing transparent extension members extending from said transparent body and establishing a layer of opaque material on said extension members to contact said surfaces.

6. The method defined in claim 1 wherein the exposed material is partially hardened for inspection and then fully hardened for permanency.

7. The method defined in claim 1 wherein the layer of photo sensitive material is developed by removing non-exposed areas to produce a graphic image.

* * * * *